United States Patent
Mahle et al.

(10) Patent No.: US 7,741,701 B2
(45) Date of Patent: Jun. 22, 2010

(54) METHOD FOR REDUCING STRESS CONCENTRATIONS ON A SEMICONDUCTOR WAFER BY SURFACE LASER TREATMENT

(75) Inventors: Richard L. Mahle, McKinney, TX (US); Peter J. Sakakini, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/374,634

(22) Filed: Mar. 13, 2006

(65) Prior Publication Data

US 2006/0172509 A1 Aug. 3, 2006

Related U.S. Application Data

(62) Division of application No. 10/612,431, filed on Jul. 2, 2003, now Pat. No. 7,041,578.

(51) Int. Cl.
*H01L 23/34* (2006.01)
*H01L 21/301* (2006.01)

(52) U.S. Cl. .................. 257/620; 257/724; 257/797; 257/E21.599; 257/E21.596; 257/E21.238; 438/460; 438/462; 451/6; 451/8; 451/57

(58) Field of Classification Search .............. 257/620, 257/724, 797, 618, 622, E21.599, E21.596, 257/E21.238, E21.237; 438/460–465; 451/6, 451/8–10, 57

See application file for complete search history.

(56) References Cited

U.S. PATENT DOCUMENTS

| | | | | |
|---|---|---|---|---|
| 6,420,245 | B1 * | 7/2002 | Manor | 438/460 |
| 6,527,965 | B1 * | 3/2003 | Gee et al. | 216/24 |
| 6,743,694 | B2 * | 6/2004 | Chung et al. | 438/401 |
| 2002/0031899 | A1 * | 3/2002 | Manor | 438/460 |
| 2003/0003688 | A1 * | 1/2003 | Tandy et al. | 438/459 |
| 2003/0104679 | A1 | 6/2003 | Dias et al. | 438/462 |
| 2003/0151053 | A1 | 8/2003 | Sun et al. | 257/79 |
| 2004/0140206 | A1 | 7/2004 | Voutsas et al. | 204/298.13 |

* cited by examiner

*Primary Examiner*—Hsien-ming Lee
(74) *Attorney, Agent, or Firm*—Yingsheng Tung; Wade J. Brady, III; Frederick J. Telecky, Jr.

(57) ABSTRACT

A method for treating an area of a semiconductor wafer surface with a laser for reducing stress concentrations is disclosed. The wafer treatment method discloses treating an area of a wafer surface with a laser beam, wherein the treated area is ablated or melted by the beam and re-solidifies into a more planar profile, thereby reducing areas of stress concentration and stress risers that contribute to cracking and chipping during wafer singulation. Preferably, the treated area has a width less than that of a scribe street, but wider than the kerf created by a wafer dicing blade. Consequently, when the wafer is singulated, the dicing blade will preferably saw through treated areas only. It will be understood that the method of the preferred embodiments may be used to treat other areas of stress concentration and surface discontinuities on the wafer, as desired.

8 Claims, 4 Drawing Sheets

METHOD FOR REDUCING STRESS CONCENTRATIONS ON A SEMICONDUCTOR WAFER BY SURFACE LASER TREATMENT

This is a divisional application of application Ser. No. 10/612,431 filed Jul. 2, 2003, which has been issued as U.S. Pat. No. 7,041,578 and the contents of which are herein incorporated by reference in its entirety.

BACKGROUND

Modern-day semiconductor devices, commonly called integrated circuits, are fabricated on semiconductor wafers, and the wafers are then diced into grids, separating the integrated circuits into individual dies prior to final assembly. Integrated circuits are typically constructed at the surface of a wafer sliced from a single-crystal silicon ingot, although other semiconductors such as gallium arsenide and germanium are also used. Individual circuit elements, which form integrated circuits, are fabricated on and into the wafer surface, or substrate.

The electrical conduction between appropriate circuit elements, and required electrical isolation between other circuit elements, is then established using alternating layers of appropriately patterned conductors and insulators. Substantially vertical, conductive tunnels called "vias" pass through insulating layers as needed to form conductive pathways between adjacent conductive layers. The creation of circuit elements and their interconnections involves a complex series of fabrication steps including ion implantation, thin film deposition, photolithography, selective etching, diffusion and various cleaning processes.

The surface area required by a given integrated circuit is a function of both the complexity of the design (i.e., the number and arrangement of individual transistors, capacitors, resistors and other electronic circuit elements) and the dimensions of each circuit element. In general, the footprint of individual dies is much smaller than the surface area of the wafer. Consequently, a single wafer can generally yield multiple—often even thousands of—integrated circuits. When patterned on a wafer or subsequent to singulation, integrated circuits are commonly referred to as "dies," a term which often refers more to the entire physical entity, including the substrate and all circuitry patterned thereon, rather than simply the circuitry.

Rectangularly shaped dies are generally arranged as closely as is feasible in a rectangular array on the wafer surface. Because of the resemblance to city maps, the spaces between dies are commonly termed "scribe streets." The scribe streets are sacrificial areas reserved for singulating the wafer into dies. Cost-effective silicon substrate use and wafer-level processing require that a single wafer yield as many usable integrated circuits as possible, which requires—among other things—minimizing the damage to the dies incurred by sawing through the scribe streets. Accordingly, several parameters are managed during singulation processes to ensure a precise cut.

The arrangement of dies on the wafer surface and the corresponding scribe streets are depicted in FIG. 1. The single-crystal wafers 10 used in semiconductor processing are generally circular, and often have an edge notch 12 that allows proper orientation of the wafer during alignment-critical fabrication and singulation processes. Older or smaller wafers may utilize a "major flat," or flat edge (not shown) instead of a notch. The integrated circuits 14 constructed on the wafer 10 are separated from one another by the grid formed by scribe streets 16. As is evident from FIG. 1, usable wafer surface area is limited both by the number and width of the scribe streets and by the circular shape at the periphery of the wafer that results in partial, non-functional devices 18. To conserve valuable usable wafer surface area, scribe streets are generally designed as narrow as possible, while still leaving adequate tolerances for the singulation process, so that rough or damaged areas do not affect active areas of the adjacent dies.

Mechanical saw singulation provides a number of advantages and is the most common die singulation process. Saw singulation allows quick, precise and accurate control over cut location and depth. Consequently, saw singulation can be used to cut either partially or completely through a wafer. Saw singulation operations typically utilize specially designed rotary dicing blades that can slice through the wafer substrate along the scribe streets defined by the individual dies. While often referred to as "sawing," saw singulation generally uses an abrading process, wherein a circular blade composed of abrasive materials embedded in a binder matrix rotates at high speeds to grind away the wafer material.

FIGS. 2a and 2b show a typical dicing wheel 20 in profile and side views, respectively, for making high-precision cuts of semiconductor wafers. The dicing wheel 20 is typically part of a larger apparatus that receives material on a flat "table" surface 22 and traverses the material with the dicing wheel on command or at regular intervals. The dicing wheel 20 of FIG. 2 is secured on a shaft 24 by a nut 26. A blade 28 is held between two portions of a hub 30. The entire assembly typically rotates between 25,000 and 45,000 rpm during singulation.

The dicing blade commonly consists of diamond grit embedded in a thin aluminum matrix, although other suitable blade materials exist. The blade thickness can vary, but typically is between 15 and 140 microns ($\mu m$). The diameter can vary similarly, but typically is between about 5 and 10 centimeters (cm). The hub diameter is typically about ninety-eight percent of the blade diameter. Thus, in a typical arrangement, only the outer 125 to 1250 $\mu m$ of the blade is exposed. This is necessary to provide adequate tensile strength and rigidity for the blade. Control over the width of the cut, or kerf, through the wafer can be obtained by proper blade selection; thinner blades provide a smaller kerf, helpful when used with narrower scribe streets.

FIG. 3 shows a magnified, cross-sectional view of a wafer 10 being cut by a saw blade 28. An adhesive tape backing 32 mounted on a circular frame (not shown) is usually attached to the wafer 10 to hold the dies in place during the singulation process. The blade 28 typically creates a cut slightly wider than the thickness of the blade, but narrower than the scribe street through which it passes. As mentioned previously, blade 28 may cut only partially through a wafer 10, but typically cuts through the entire thickness of the wafer, slightly scoring the adhesive 32 in the process. Alternatively, a series of dicing blades with different thicknesses may be used, with a first blade cutting the wafer to a first depth, and a second, generally thinner blade passing through the cut to completely saw through the wafer.

Currently, prior to singulation, wafers may undergo backgrind and polishing operations, abrasive processes intended to reduce the thickness of the wafer to a desired value and ensure global planarity, and to smooth the backside surface of the wafer to reduce roughness, respectively. Achieving a planar and smooth wafer backside is important for many reasons, but it has been discovered that surface roughness can contribute to greater material stresses on singulation, and consequently to cracking and related "chipping" of the sawn edges.

In a typical singulation process, wafers are typically singulated with the dicing blade first impacting the top, active surface of the wafer, slicing through the bulk of the wafer, and finally cutting through the backside of the wafer.

Stress risers generally originate from relatively sharp angles or other discontinuities on the material surface, and may initiate local cracking and/or chipping when contacted with the dicing blade. A stress riser is a notch or other non-planar discontinuity in a material that may be a starting ingredient for a crack or tear. Silicon is a particularly brittle material that is especially susceptible to the propagation of cracks.

In the area of a stress riser, the cohesive strength of the material may be exceeded under pressure from the dicing saw, and the material may fracture, most likely in a crevice between two irregularities. If no flaw were present, under a similar load, the fracture strength would be equal to the cohesive strength of the material—i.e. greater stress would be required to fracture the material. As the saw slices through the wafer down towards the wafer backside, the stresses created propagate through the wafer material and may then lead to even greater chipping on the backside. As the wafer backside is under a tensile stress during this process, due to the greater outward forces pulling the material apart, cracking or chipping on this bottom surface may be more severe that that on the active surface, which would generally be under a compressive stress in the area of the saw blade.

Greater material chipping is generally seen on surfaces opposite the surface first contacted by the blade. It will be understood that, while the singulation processes shown describe a wafer being sawn from the active surface down, this arrangement may vary depending on process setup. However, if one of the surfaces is treated to increase planarity, due to the reduction of stress risers and propagation of stresses throughout the material, both top and bottom surfaces may experience reduced cracking and chipping as a result.

As shown in a perspective view of a die backside in FIG. 4, dies 10 are prone to chipping during singulation. Chipping occurs when fragment-like voids 40, or areas where material has cracked then chipped off, are created on die corners formed by the top surface (not shown) and a side 44 of the die, and the bottom surface 46 and a side 44 of the die. It will be understood that material voids 40 caused by chipping exist in several shapes and sizes along the sawn edges, but generally result in shards of material being removed. During singulation, shard-like remnants may be deposited on the active surface of the wafer, an area particularly sensitive to debris and other particles. Due to the possibility of particulate contamination and of cracking and chipping damaging nearby circuitry structures, it is important to reduce this occurrence as much as possible.

Often, after saw singulation, dies are lifted from the adhesive backing with a "pick and place" apparatus, which places each die on a package leadframe or substrate. The leadframe or substrate is then electrically interconnected to the die using wire bonding or other bonding process. However, a growing trend is for semiconductor suppliers to provide their customers with unpackaged dies, which may be designed for direct attachment to a motherboard, such as with a C4 bump attach process, or alternatively, designed for later packaging by the customer. While packaged dies would obscure any visual evidence of die edge cracking or chipping, unpackaged dies do not. The presence of cracking and chipping is not only cosmetic; cracking and chipping on the die edges can propagate stresses through the die material, potentially damaging the active circuitry and impairing functionality of the die, which can lead to customer returns of the defective product and lost revenues. Consequently, reducing the die edge damage incurred by singulation is of growing concern.

Several parameters can be adjusted to improve the quality of wafer singulation and to reduce cracking and chipping. Increasing the rotational speed of the blade may lessen damage to the wafer, as may reducing the linear speed (or feed) of the blade relative to the wafer. Selecting a dicing blade having a different size or shape of particles, as well as a different profile shape (such as square versus rounded) may produce a different cut quality. Similarly, selecting a blade with a different thickness may vary kerf width, while selecting a blade with a larger diameter may reduce surface contact forces, since the contact angle is likely to be smaller. Other process variations used to control cut quality include using multiple passes of a single blade, following a thicker blade with a thinner blade, or reversing blade rotation relative to feed direction. In addition, replacing the dicing blade more frequently may assist in lowering damage done to the wafer during singulation, while selecting a tackier adhesive backing may provide a greater resistance to tensile stresses on the constrained side, potentially reducing cracking and chipping.

Acceptable cuts can be made by adjusting one or more of the aforementioned parameters, but these parameters must be closely monitored to produce adequate results. Slight process variations can inadvertently produce unacceptable singulation results. What is needed is a process by which the wafer surface can be treated prior to singulation, smoothing the surface to reduce the occurrence of cracking and chipping within a wider range of process settings, and also to reduce the number of semiconductor rejects or customer returns related to material fractures and stress-induced damage. As adding new operations and associated equipment sets can increase the cost of fabrication, increase processing time, and reduce manufacturing throughput, it is also desired to implement a wafer surface treatment with a minimum of disruption to existing process flows.

BRIEF SUMMARY

A method for treating an area of a semiconductor wafer surface with a laser for reducing stress concentrations is disclosed, as well as a semiconductor wafer treated in accordance with the preferred embodiments. The method discloses treating the area with a laser beam, wherein the treated area is melted by the beam and re-solidifies into a more planar profile, reducing stress risers in the process. Preferably, the treated area is ablated by the laser beam, leaving a substantially flat profile with substantially the same material properties, but with reduced areas of stress concentration.

Typically, the treated area has a width less than that of a scribe street, such that the treated area will lie within a scribe street without extending onto the active features of the adjacent dies. The areas targeted for treatment typically correspond to the scribe streets on either the top, active surface of the wafer, or the area directly underneath the scribe streets on the wafer backside. However, it will be understood that the method of the preferred embodiments may be used to treat other areas of stress concentration and surface discontinuities on the wafer, as desired. When the wafer is singulated, the dicing blade will preferably saw through treated areas only. Consequently, the treated areas are preferably wider than the kerf created by a wafer dicing blade.

BRIEF DESCRIPTION OF THE DRAWINGS

For a detailed description of the embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "die" ("dies" for plural) refers generically to an integrated circuit, in various stages of completion, including the underlying semiconductor substrate and all circuitry patterned thereon. The term "wafer" refers to a generally round, single-crystal semiconductor substrate upon which integrated circuits are fabricated in the form of dies. The term "interconnect" refers to a physical connection providing possible electrical communication between the connected items. To the extent that any term is not specially defined in this specification, the intent is that the term is to be given its plain and ordinary meaning.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
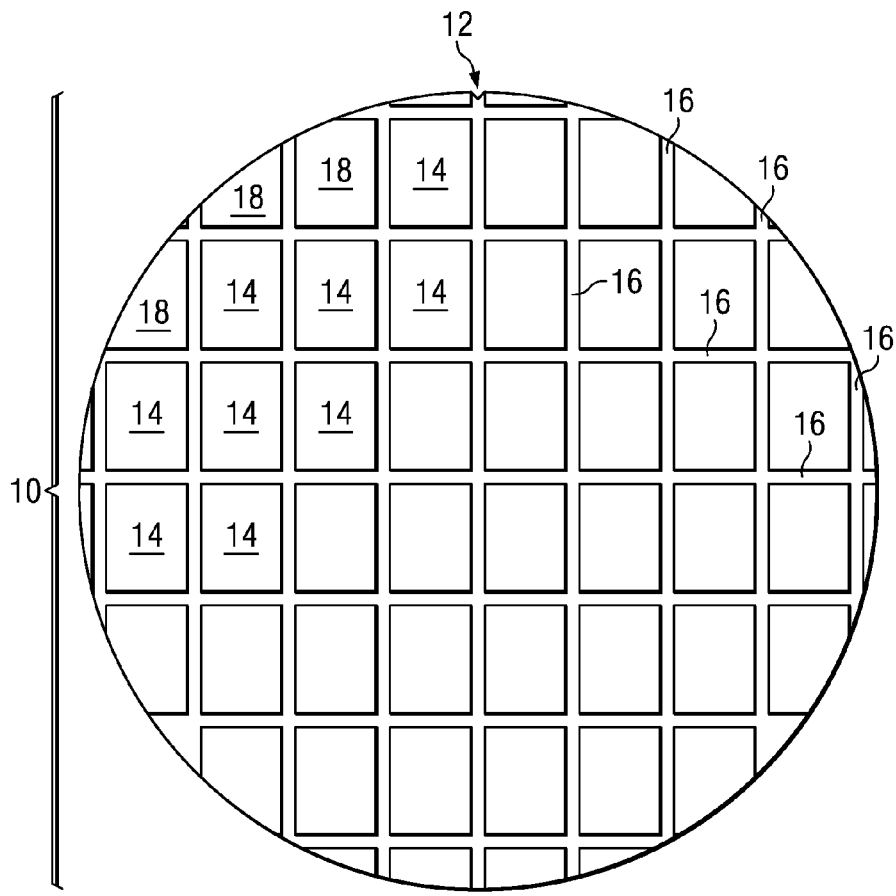
FIG. 1 is a top view of a semiconductor wafer surface.
Figure 3:
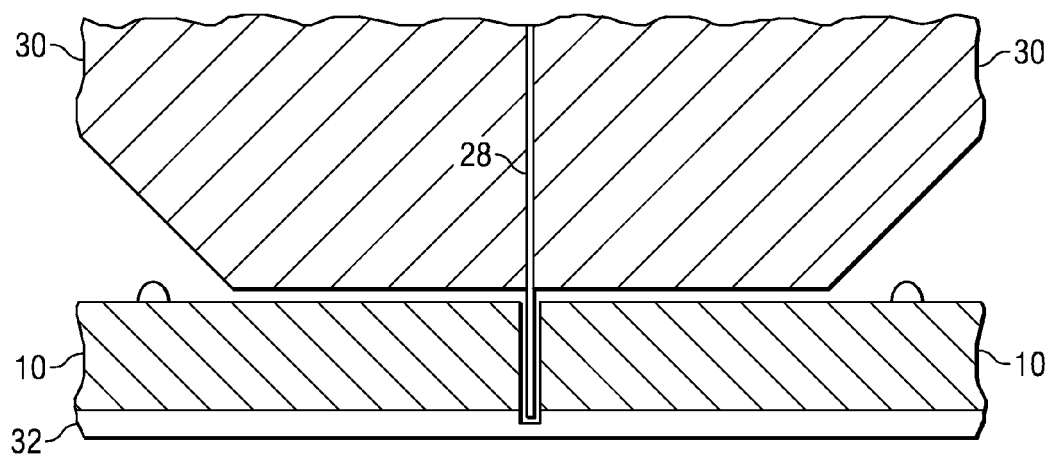
FIG. 3 is a magnified cross-sectional view of a wafer being cut by the dicing wheel.
Figure 2A:
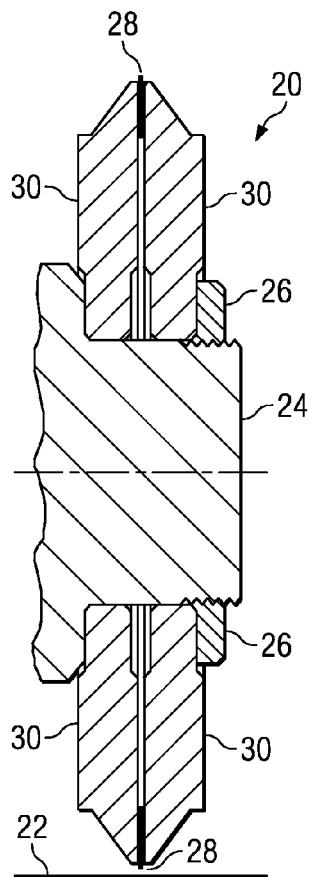
FIG. 2a is a cross-sectional view of a typical dicing wheel.
Figure 2B:
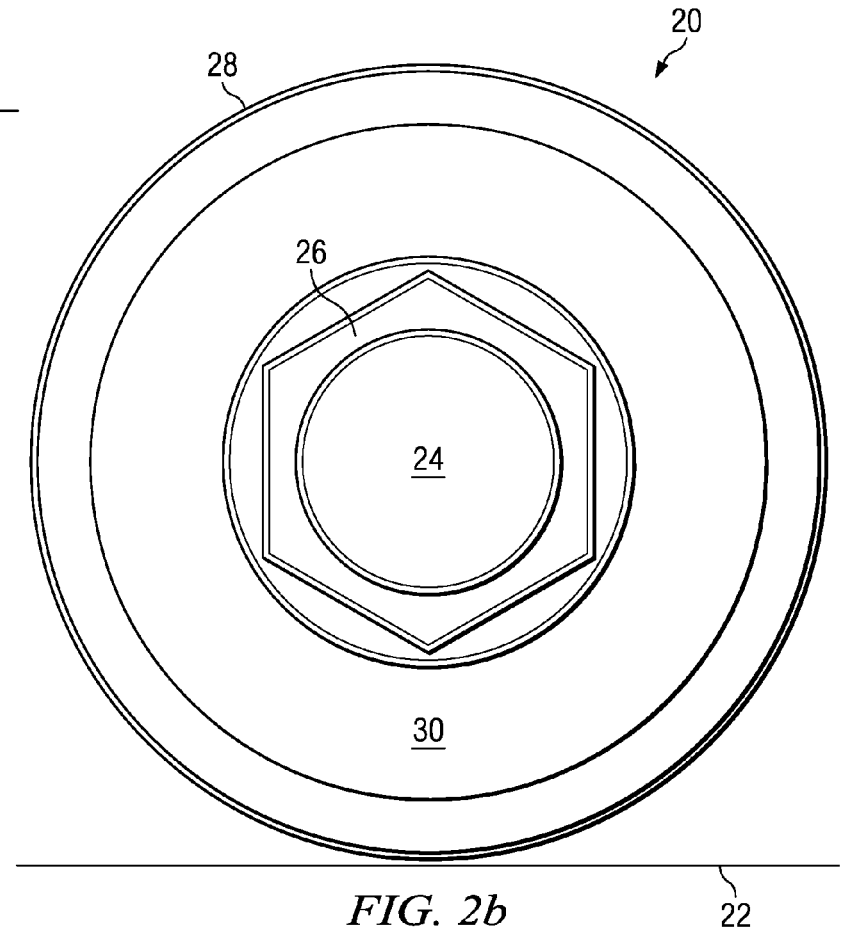
FIG. 2b is a side view of the typical dicing wheel.
Figure 4:
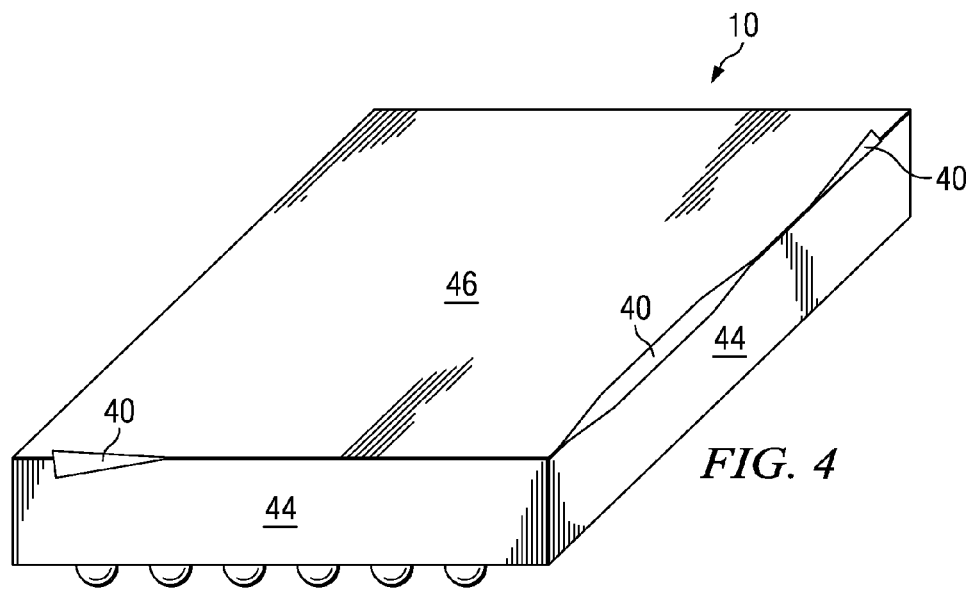
FIG. 4 is a perspective view of a singulated semiconductor die with evidence of chipping.

A method is disclosed for reducing stress concentration levels on the surfaces of a semiconductor wafer by exposure to a laser beam, thereby lowering the potential for chipping and cracking of the wafer during singulation. Referring briefly to FIG. 1, the active surface of a semiconductor wafer 10 typically includes scribe streets 16, sacrificial areas that are sawn through when singulating integrated circuits 14. Non-planar surface irregularities along the areas to be sawn through may act as "stress risers," areas of stress concentration that can prove structurally detrimental as the wafer is singulated into individual integrated circuits, or dies. Stresses emanating from these stress risers may increase cracking and chipping damage along the sawn edges of the singulated dies. In addition, material stresses within the dies as a result of these stress risers may result in faulty or non-functional integrated circuits.

In the presence of stress risers, or irregularities in the bulk or surface of a material, a material may fracture under a reduced load. During saw singulation, a wafer experiences both a compressive force—on its surface in the vicinity of the dicing blade—and a tensile force—on the opposite surface in the area under the blade. The mechanical action of the blade on the first impacted surface (e.g. the top) may cause local cracking and chipping of the wafer material. However, due to the presence of stress risers and the associated propagation of stresses, even greater cracking and chipping may be evident on the opposite surface (e.g. the wafer backside), the last surface to be sawn through. It is therefore desired to treat at least one of the surfaces to reduce surface irregularities—in this case, non-planar discontinuities—in order to reduce chipping and cracking seen on both wafer surfaces after saw singulation.

Figure 5:
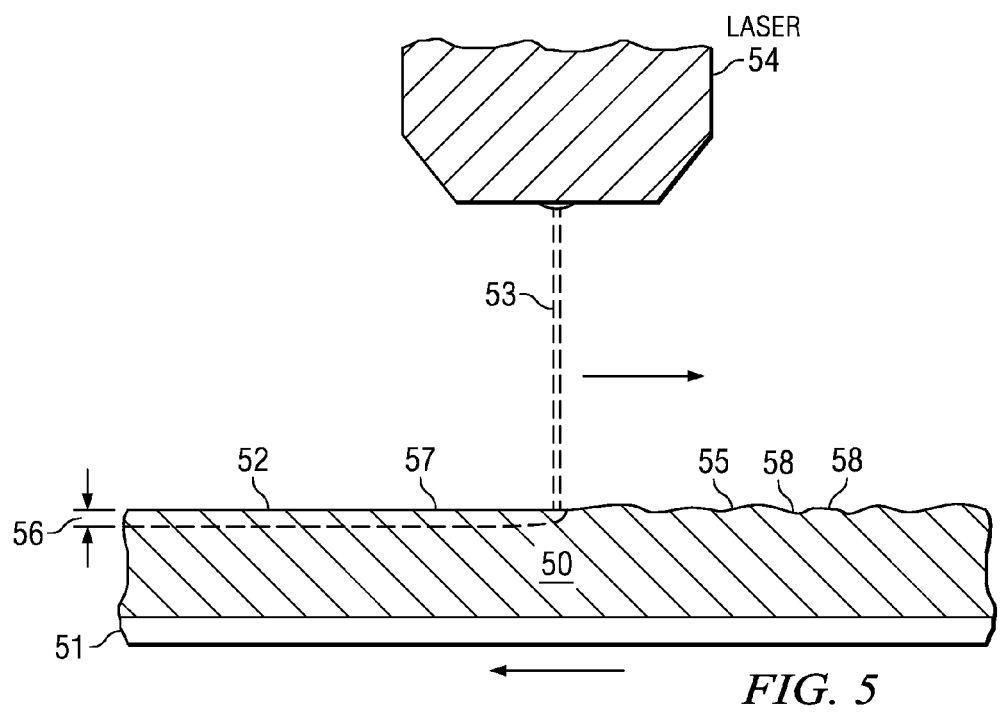
FIG. 5 is a cross-sectional side view of a wafer being treated in accordance with the preferred embodiments.

Referring now to FIG. 5, a wafer 50 is preferably constrained on a table-like surface 51, to ensure precise positioning. In a preferred embodiment of the present invention, the wafer surface 52 to be sawn through is treated by exposure to a laser beam 53, emitted by an apparatus 54. The laser beam 53 travels over the surface 52 in the direction shown, preferably in a grid-like pattern matching the scribe streets on the front of the wafer. During the surface treatment process, the non-planar surface material (generally silicon) 55 may be ablated, and melts slightly to a relatively shallow depth 56 when exposed to the laser beam 53. At least a portion of the surface irregularities 55 may be vaporized, reducing notch stresses or stress concentrators, as well as the potential for crack propagation. The treated material then re-solidifies into a more planar profile 57, reducing or eliminating surface discontinuities 58, which include both ridges and crevices. As silicon is a single-crystal material, the treated area has largely the same material properties as the untreated areas, only with a smoother surface profile and lower resulting internal stresses during singulation. Preferably, the width of the treated area is slightly wider than the kerf to be formed later by a dicing blade, so that the blade does not saw through an untreated area.

Figure 6A:
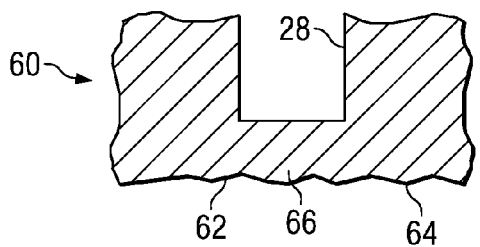
FIG. 6a is a cross-sectional profile view of a wafer-dicing blade and a rough wafer surface.
Figure 6B:
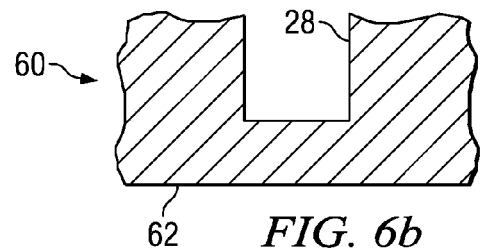
FIG. 6b is a cross-sectional profile view of a wafer-dicing blade and a smooth wafer surface.

Referring now to FIG. 6a, a wafer-dicing blade 28 is shown in profile cutting through a wafer 60 and nearing an irregular wafer backside surface 62. Due to the presence of surface irregularities 64 on the backside, tensile forces acting on the material may cause cracks 66 present to propagate. The wafer-dicing blade 28 can physically jar material from these cracks 66, leading to chipping. Conversely, as shown in profile in FIG. 6b, a smoother wafer backside surface 62, such as one treated using the method of the present invention, has fewer irregularities that can act as stress risers. With the reduction of these stress risers, tensile forces present during saw singulation are less likely to contribute to cracking or chipping on this exit surface, since the force needed to induce such damage may be higher on a smoother surface.

Wafers are commonly subjected to laser marking processes, wherein a laser beam with relatively high power and slow scan speed engraves markings into the front or back surfaces, for wafer identification or die-labeling purposes, respectively. These "hard marks" typically remove material, which may cause particulate contamination to the wafer, and may leave raised edges along a the path of the beam, further reducing wafer planarity. In addition, these hard marks may weaken the silicon, as the reduced local wafer thickness may act like a scribe line or stress concentration point. Unlike many conventional hard-marking lasers, which can produce raised kerfs, "soft-marking" lasers have the capability to lightly melt a wafer surface, which recrystallizes with different finish and virtually no surface depression or particulate contamination.

A laser for treating wafer surfaces in accordance with a preferred embodiment of the present invention is preferably a diode-pumped, charge-loaded laser, emitting light with a wavelength in the range of green or infrared laser wavelengths. It will be understood that soft-marking lasers having wavelengths outside the green or infrared wavelength ranges may also provide suitable results. Preferably, wafer surfaces treated in accordance with the preferred embodiments are treated with a soft-marking laser, such as models marketed under the trade names WaferMark® CSP300 by GSI Lumonics Inc. of Nepean, Ontario; Waferlase® Ultra by AB Lasers of Acton, Massachusetts; or Soft Touch by Duc Ho of Texmac, Inc of Santa Clara, Calif.

Lasers for use in accordance with the preferred embodiments may be characterized by a preferred light emission color and an associated wavelength range. Preferably, a laser with green light having a wavelength ranging from about 300 nanometers (nm) to about 600 nm is used to treat a wafer surface. More preferably, a laser with green light used in accordance with a preferred embodiment has a wavelength ranging from about 500 nm to about 550 nm. Most preferably, a laser with green light used in accordance with a preferred embodiment has a wavelength of about 532 nm.

Green laser light has a wavelength that does not fully penetrate the single-crystal structure of silicon. Consequently, this variety of laser light is efficient at treating the wafer surface, since most of the beam energy is targeted at the wafer surface and does not significantly penetrate the surface. In addition, the relatively short wavelength of green laser light allows the beam to be pulsed at high rates, so a great deal of energy per unit time can be output. An efficient surface treatment is valuable in a throughput-critical wafer-processing environment.

In an alternative embodiment, a laser with infrared light having a wavelength ranging from about 600 nanometers (nm) to about 4000 nm is used to treat a wafer surface. More preferably, a laser with infrared light used in accordance with an alternative embodiment has a wavelength ranging from about 1000 nm to about 2000 nm. Most preferably, a laser with infrared light used in accordance with an alternative embodiment has a wavelength ranging of about 1064 nm. However, it will be understood that several laser types emitting laser light with a variety of colors and wavelengths may produce suitable wafer planarization results. It will also be understood that a particular type of laser may emit a different color light operating at one wavelength within a preferred wavelength range than it emits operating at another wavelength within the range.

Lasers for use in accordance with the preferred embodiments may also be characterized by laser type and a preferred wavelength range. In one embodiment, a frequency-doubled Nd:YAG laser is used, with a wavelength preferably ranging between about 200 nm and about 550 nm. More preferably, the frequency-doubled Nd:YAG laser has a wavelength between about 300 nm and about 540 nm. Most preferably, the frequency-doubled Nd:YAG laser has a wavelength of about 532 nm. In another embodiment, an excimer laser is used, preferably having a wavelength between about 190 nm and about 375 nm. More preferably, the excimer laser has a wavelength between about 196 nm and about 352 nm. Most preferably, the excimer laser has a wavelength of about 200 nm.

In another embodiment, a helium-neon laser is used, preferably having a wavelength between about 600 nm and 700 nm. More preferably, the helium-neon laser has a wavelength between about 632 nm and about 670 nm. Most preferably, the helium-neon laser has a wavelength of about 632 nm. In another alternative embodiment, an Nd:YAG laser is used, preferably having a wavelength between about 1060 nm and 1070 nm. More preferably, the Nd:YAG laser has a wavelength between about 1063 nm and about 1065 nm. Most preferably, the Nd:YAG laser has a wavelength of about 1064 nm. In yet another alternative embodiment, a carbon dioxide ($CO_2$) laser is used, preferably having a wavelength between about 10,000 nm and 11,000 nm. More preferably, the $CO_2$ laser has a wavelength between about 10,500 nm and about 10,700 nm. Most preferably, the $CO_2$ laser has a wavelength of about 10,600 nm.

There are many types of lasers available for research, medical, industrial, and commercial uses. As previously disclosed, there are several ways of characterizing a particular laser emission. Lasers may be further characterized by the kind of lasing medium they use—e.g. solid state, gas, excimer, dye, or semiconductor lasers. Lasers may also be further characterized by the duration of laser emission—e.g. continuous wave or pulsed laser. A Q-switched laser is an example of a pulsed laser, which contains a shutter-like device that does not allow emission of laser light until opened. Energy is built-up in a Q-switched laser and released by opening the device to produce a single, intense laser pulse. An example of a Q-switched laser is the 350-nm laser manufactured by ESI Electro Scientific Industries.

Modifying the power, pulse rate, and scan speed (or linear speed over the wafer surface) of the laser can precisely control the properties of the treated area. A charged-pump laser builds energy, then releases a pulse. The rate at which pulses are released can be set to a suitably high level, and the scan speed adjusted, so that the laser inscribes a very close, or even overlapping, series of dots on the surface, forming a treated line. Additionally, defocusing the beam can reduce the amount by which the laser beam penetrates the surface, further controlling planarity of the treated area. Further, an area of the wafer may be treated in accordance with the preferred embodiments more than once. As a single pass of a laser beam over a scribe street is effectively not changing the material properties other than smoothing the profile, it follows that multiple passes of the laser beam over a previously treated scribe street may have additional planarization benefits.

Figure 7A:
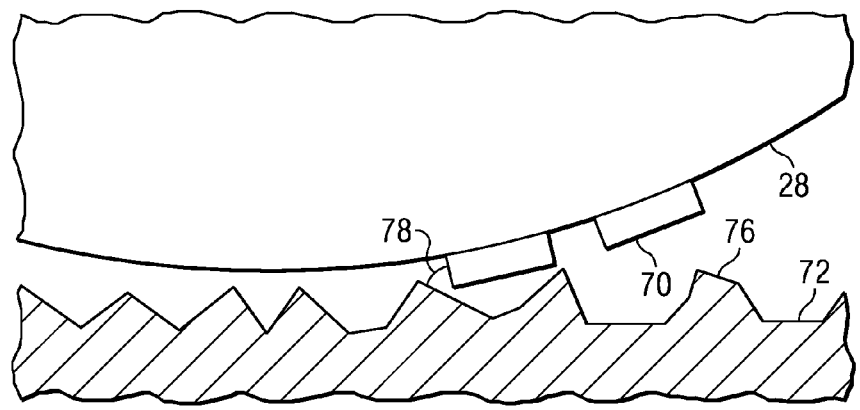
FIG. 7a is a cross-sectional side view of a wafer-dicing blade and a rough wafer surface.

In an alternative embodiment, the active surface of the wafer can be laser treated to improve planarity. Due to the close spacing between integrated circuits on the active surface, this method would require tight control over the width of the area within the scribe streets treated by the laser. Treatment of the active wafer surface would address the reduction of surface contact forces on initial contact of the dicing blade with the wafer. Referring now to FIG. 7a, a cross-sectional side view is shown of a wafer-dicing blade 28 impacting a rough, untreated wafer surface 72. In common practice, this wafer surface 72 first impacted by the dicing blade is a top (or active) surface of the wafer. Although shown as rectangular, it will be understood that saw teeth 70 may vary in shape, but are generally designed to impact and abrade the wafer surface 72, with greater surface contact angles 78 (i.e. the angle between a saw tooth 70 and adjacent surface irregularity 76) being preferable.

Figure 7B:
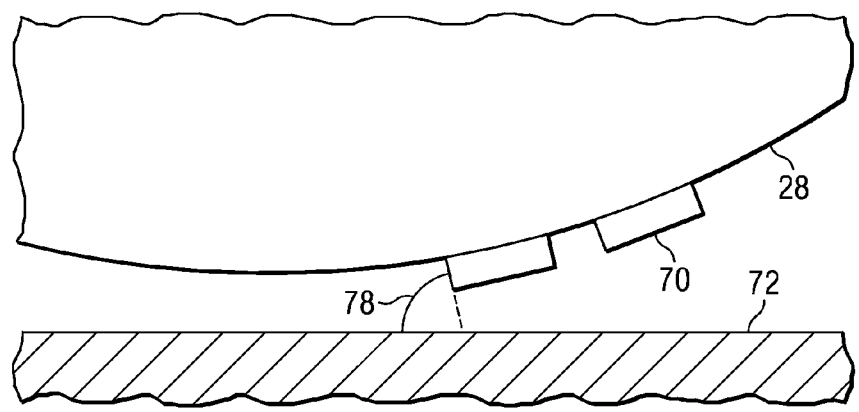
FIG. 7b is a cross-sectional side view of a wafer-dicing blade and a smooth wafer surface.

Non-planar wafer surfaces 72 suffer relatively great impact stresses on contact with saw teeth 70, which can lead to larger cracks and more severe chipping. Since impact stresses approach a maximum value when the surface contact angle 78 approaches zero, it is desired to smooth the wafer surface 72 prior to saw singulation. As shown in the cross-sectional side view of FIG. 7b, a relatively smooth wafer surface 72, which may be obtained using the method of the present invention, has reduced surface stresses due to a larger surface contact angle 78. It will be understood that the laser surface treatment method of the present invention is intended to address local surface irregularities, and not global material planarity of a wafer.

With the advent of soft-marking laser technology, semiconductor wafers can be treated in accordance with the present invention without significant disruption to existing process flows. In many common process flows, part numbers and wafer identification codes are scored into a wafer surface with a laser-marking process prior to singulation. Wafer identification codes are usually marked on the active surface of a wafer. Die part numbers are commonly marked on the wafer backside, concurrent with the growing trend of selling unpackaged dies. In many cases, a small adjustment to the laser marking process can be continued to include "marking" the wafer with a treated grid area in accordance with the preferred embodiments.

The treated area would preferably be aligned with the existing scribe streets, whether on the active surface between the dies or on the backside, so that later singulation would dice through the treated areas, and only the treated areas. Preferably, laser marking and laser surface treating can be performed with the same laser using the same or similar settings to minimize processing time. As previously mentioned, laser settings can be modified, if necessary, to customize the width and other parameters of the treated area. This capacity provides the option of using a single laser for both marking and surface treating in accordance with the present invention, without needing an additional wafer transfer step and equipment setup.

The above discussion is meant to be illustrative of the principles and various embodiments of the present invention. Numerous variations and modifications will become apparent to those skilled in the art once the above disclosure is fully appreciated. For example, local stress concentration reduction can be attained, if needed, in areas of a semiconductor wafer other than those that are to be sawn through, using the surface treatment method of the present invention. In addition, singulated integrated chips may be treated with the method of the present invention to lessen the probability for damage during later assembly processes. It is intended that the following claims be interpreted to embrace all such variations and modifications.

What is claimed is:

1. A semiconductor wafer, comprising:
a first surface and a second surface, and dies in a two dimensional array and scribe streets between the dies; said scribe streets including treated regions having a more planar surface than a surface of regions adjacent the treated regions.

2. The semiconductor wafer of claim 1, in which the first surface is an active surface.

3. The semiconductor wafer of claim 1, in which the first surface is a backside surface.

4. The semiconductor wafer of claim 1, further comprising saw kerfs formed parallel the scribe streets and extending towards the second surface.

5. The semiconductor wafer of claim 4, in which the saw kerfs singulate the wafer into semiconductor chips.

6. The semiconductor chip of claim 5, further comprising an integrated circuit.

7. The semiconductor wafer of claim 4, wherein the treated regions have a width wider than the saw kerfs.

8. The semiconductor wafer of claim 4, in which the more planar surface is a semiconductor surface.

* * * * *